(12) United States Patent
    Rothschild et al.

(10) Patent No.: US 11,191,142 B2
(45) Date of Patent: Nov. 30, 2021

(54) BATTERY-POWERED CURRENT REGULATOR FOR PULSED LOADS

(71) Applicant: ELBIT SYSTEMS ELECTRO-OPTICS ELOP LTD., Rehovot (IL)

(72) Inventors: Daniel Rothschild, Rehovot (IL); Arie Zilbershtein, Rehovot (IL); Alexander Zak, Rehovot (IL)

(73) Assignee: ELBIT SYSTEMS ELECTRO-OPTICS ELOP LTD., Rehovot (IL)

( * ) Notice: Subject to any disclaimer, the term of this patent is extended or adjusted under 35 U.S.C. 154(b) by 0 days.

(21) Appl. No.: 16/762,366

(22) PCT Filed: Nov. 8, 2018

(86) PCT No.: PCT/IL2018/051209
    § 371 (c)(1),
    (2) Date: May 7, 2020

(87) PCT Pub. No.: WO2019/092719
    PCT Pub. Date: May 16, 2019

(65) Prior Publication Data
    US 2020/0267815 A1    Aug. 20, 2020

(30) Foreign Application Priority Data
    Nov. 9, 2017   (IL) .......................................... 255585

(51) Int. Cl.
    *H05B 45/345*   (2020.01)
    *H05B 45/325*   (2020.01)
    (Continued)

(52) U.S. Cl.
    CPC ............ *H05B 45/345* (2020.01); *H02J 7/007* (2013.01); *H05B 45/325* (2020.01); *H05B 45/335* (2020.01)

(58) Field of Classification Search
    CPC .. H05B 45/345; H05B 45/325; H05B 45/335; H02J 7/007; H02M 1/0009;
    (Continued)

(56) References Cited

U.S. PATENT DOCUMENTS 6,272,025 B1 *  8/2001  Riggio .................... H02M 1/14
                                                    363/24
7,019,503 B1    3/2006  Ortiz et al.
                (Continued)

OTHER PUBLICATIONS

International Search Report for PCT Application No. PCT/IL2018/051209, dated Feb. 18, 2019.

*Primary Examiner* — Abdullah A Riyami
*Assistant Examiner* — Syed M Kaiser
(74) *Attorney, Agent, or Firm* — Pearl Cohen Zedek Latzer Baratz LLP

(57) ABSTRACT

A current regulator for a pulsed load is provided herein. The current regulator may include: an input power source; a current sense circuit; a capacitive energy storage device; a current sink driver; a current source charger which receives input current from the input power source via the current sense circuit and provides a charge for the capacitive energy storage device coupled between the current source charger and the current sink driver which drives the pulsed load; a power monitor circuitry which generates a feedback signal, based on a function of the input power and a function of at least one of: voltage across the capacitive energy storage, or voltage across the current sink driver; and a pulse width modulation (PWM) or pulse frequency modulation (PFM) circuitry which controls the current source charger based on the feedback signal.

9 Claims, 4 Drawing Sheets

(51) Int. Cl.
*H05B 45/335* (2020.01)
*H02J 7/00* (2006.01)

(58) Field of Classification Search
CPC .... H02M 1/0016–0022; H01S 5/06808; H01S 3/0912
See application file for complete search history.

(56) References Cited

U.S. PATENT DOCUMENTS

| | | | |
|---|---|---|---|
| 7,352,162 B1* | 4/2008 | Chang | H02M 3/156 |
| | | | 323/290 |
| 10,141,830 B1* | 11/2018 | Chung | H05B 45/37 |
| 2002/0113559 A1* | 8/2002 | Lam | H05B 41/2855 |
| | | | 315/224 |
| 2004/0068301 A1* | 4/2004 | Waltman | A61N 1/39 |
| | | | 607/5 |
| 2005/0185428 A1 | 8/2005 | Crawford et al. | |
| 2007/0145830 A1* | 6/2007 | Lee | H02J 50/12 |
| | | | 307/135 |
| 2008/0123706 A1* | 5/2008 | Zak | H01S 5/042 |
| | | | 372/38.04 |
| 2011/0085576 A1 | 4/2011 | Crawford et al. | |
| 2012/0039349 A1* | 2/2012 | Priest | H01S 5/3402 |
| | | | 372/38.01 |
| 2012/0200278 A1* | 8/2012 | Yost | F42C 11/008 |
| | | | 323/299 |
| 2012/0268026 A1* | 10/2012 | Crawford | H05B 45/37 |
| | | | 315/210 |
| 2013/0148396 A1* | 6/2013 | Walters | H02M 1/4225 |
| | | | 363/126 |
| 2013/0238048 A1* | 9/2013 | Almendinger | H02J 7/007 |
| | | | 607/40 |
| 2014/0269799 A1* | 9/2014 | Ortiz | H01S 5/0428 |
| | | | 372/38.02 |
| 2015/0061624 A1 | 3/2015 | Lalithambika et al. | |
| 2015/0130372 A1* | 5/2015 | Chitta | H02M 1/08 |
| | | | 315/307 |
| 2016/0204631 A1* | 7/2016 | Houston | H02H 3/202 |
| | | | 320/162 |
| 2016/0352227 A1* | 12/2016 | Houston | H02M 1/08 |
| 2017/0264076 A1* | 9/2017 | Moyer | H01S 5/0428 |
| 2019/0016249 A1* | 1/2019 | Ichikawa | H01L 33/00 |

\* cited by examiner

BATTERY-POWERED CURRENT REGULATOR FOR PULSED LOADS

CROSS-REFERENCE TO RELATED APPLICATIONS

This application is a National Phase application of PCT International Application No. PCT/IL2018/051209, International Filing Date Nov. 8, 2018, entitled: "BATTERY-POWERED CURRENT REGULATOR FOR PULSED LOADS", Published on May 16, 2019 under PCT International Application Publication No. WO 2019/092719 which claims the priority of Israel Patent Application No. 255585, filed Nov. 9, 2017, which is hereby incorporated by reference in its entirety.

FIELD OF THE INVENTION

The present invention relates generally to the field of power electronics, and more particularly to regulated current sources.

BACKGROUND OF THE INVENTION

Batteries are being used today as power sources for devices and systems that previously could not operate effectively with batteries as a power source due to their limited current supply capability. Such devices and systems may include pulsed loads consuming high pulsed load currents such as radars, high power pulsed lasers, and electromagnetic forming devices.

In order to address this problem, some current regulators for pulsed loads, where the power source is a battery, have been recently developed. For example, US Patent Application Publication No. US20140269799 teaches a current driver that utilizes a capacitive energy storage coupled between an active line filter and the current driver. The capacitive energy storage device is configured to receive the filter output power from the active line filter and provide the input power to the current driver.

The ongoing challenges in designing battery-powered current regulators for pulsed loads that utilize a capacitor in the feedback loop are the efficiency of the power regulating, and the size and weight of the energy storage capacitor device, as battery powered devices usually face strict size constraints.

BRIEF SUMMARY OF THE INVENTION

Some embodiments of the present invention provide a current regulator for providing pulsed power to a load. The current regulator may include: an input power source; a current sense circuit; a capacitive energy storage device; a current sink driver; a current source charger which receives input current from the input power source via the current sense circuit and provides a charge for the capacitive energy storage device coupled between the current source charger and the current sink driver which drives the pulsed load; a power monitor circuitry which generates a feedback signal, based on a function of the input power and a function of at least one of: voltage across the capacitive energy storage, or voltage across the current sink driver; and a pulse width modulation (PWM) or pulse frequency modulation (PFM) circuitry which controls the current source charger based on the feedback signal.

According to some embodiments of the present invention, the feedback signal may be based on a voltage across the current sink driver and a voltage across the current sense circuit.

According to some embodiments of the present invention, the input power source may include a battery.

According to some embodiments of the present invention, the pulsed load may include laser diodes.

According to some embodiments of the present invention, the capacity storage device may be a capacitor connected via analog switch in parallel to the current sink driver.

According to some embodiments of the present invention, the current regulator charger may be regulated by using two feed forward signals, one from the input current sense and one from the capacity storage device, wherein the two voltage signals are multiplied by the power monitor to yield the feedback signal.

According to some embodiments of the present invention, the capacitive storage device is charged by the current source charger that is connected in parallel and causes a feed forward signal to the power monitor circuitry to rise and minimize the power consumption of the current source charger by changing the feedback signal so that the current sink driver operates at optimum efficiency.

According to some embodiments of the present invention, the power monitor circuitry may include a nonlinear amplifier connected to the input power source and two comparators having inputs connected to the capacity energy storage device and to respective reference voltage sources, and wherein outputs of the comparators supply control signals to the current source charger which provides charge/discharge of the capacity storage device, and wherein the voltage across the capacity storage device and the voltage from the nonlinear amplifier affect the feedback signal.

According to some embodiments of the present invention, wherein the capacitive storage device may be charged by the current source charger that is connected in parallel and causes a feed forward signal to the power monitor circuitry to rise and minimize the power consumption of the current source charger by changing the feedback signal so that the current sink driver operates at optimum efficiency.

These additional, and/or other aspects and/or advantages of the present invention are set forth in the detailed description which follows.

BRIEF DESCRIPTION OF THE DRAWINGS

For a better understanding of the invention and in order to show how it may be implemented, references are made, purely by way of example, to the accompanying drawings in which like numerals designate corresponding elements or sections. In the accompanying drawings.

DETAILED DESCRIPTION OF THE INVENTION

Figure 1:
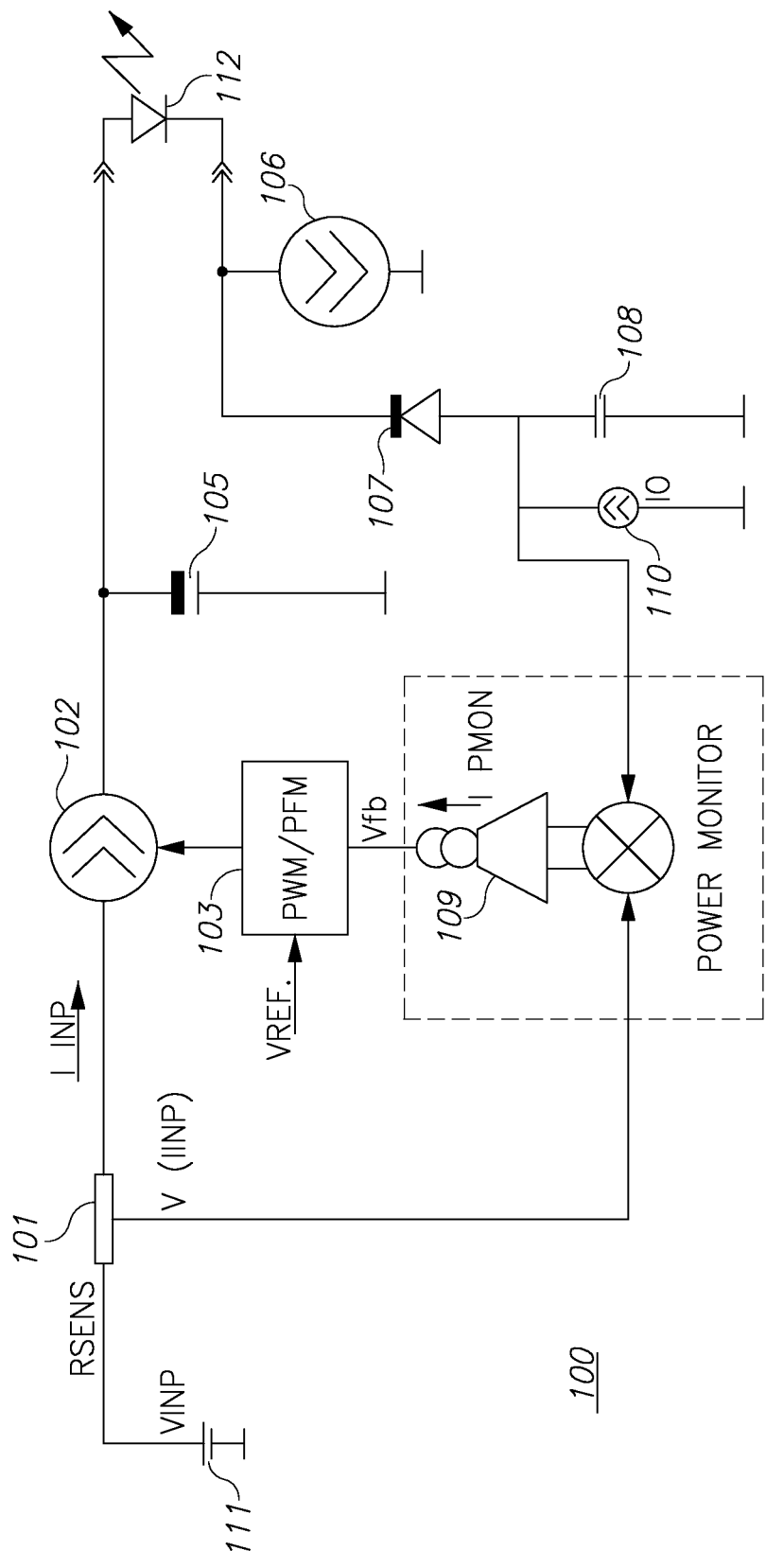
FIG. 1 shows a circuit diagram illustrating a current regulator in accordance with one embodiments of the present invention.

With specific reference now to the drawings in detail, it is stressed that the particulars shown are for the purpose of example and solely for discussing the preferred embodiments of the present invention, and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the invention may be embodied in practice.

Before explaining the embodiments of the invention in detail, it is to be understood that the invention is not limited in its application to the details of construction and the arrangement of the components set forth in the following descriptions or illustrated in the drawings. The invention is applicable to other embodiments and may be practiced or carried out in various ways. Also, it is to be understood that the phraseology and terminology employed herein is for the purpose of description and should not be regarded as limiting.

FIG. 1 shows a circuit diagram illustrating a power supply circuit 100 in accordance with a first embodiment of the present invention. Power supply circuit 100 is a current regulator usable for powering laser diodes as described herein in detail. Circuit 100 may include the following components: an energy storage capacitor 105, a current source 102 which acts as a charger for energy storage capacitor 105, a sink current regulator 106 which acts as a driver, a pulse width modulation (PWM) or a pulse frequency modulation (PFM) module 103, power monitor 109, input current sense 101($R_{sens}$), voltage storage capacitor 108, an offset (io) current source 110 and an analog switch, possibly a diode 107.

Figure 2:
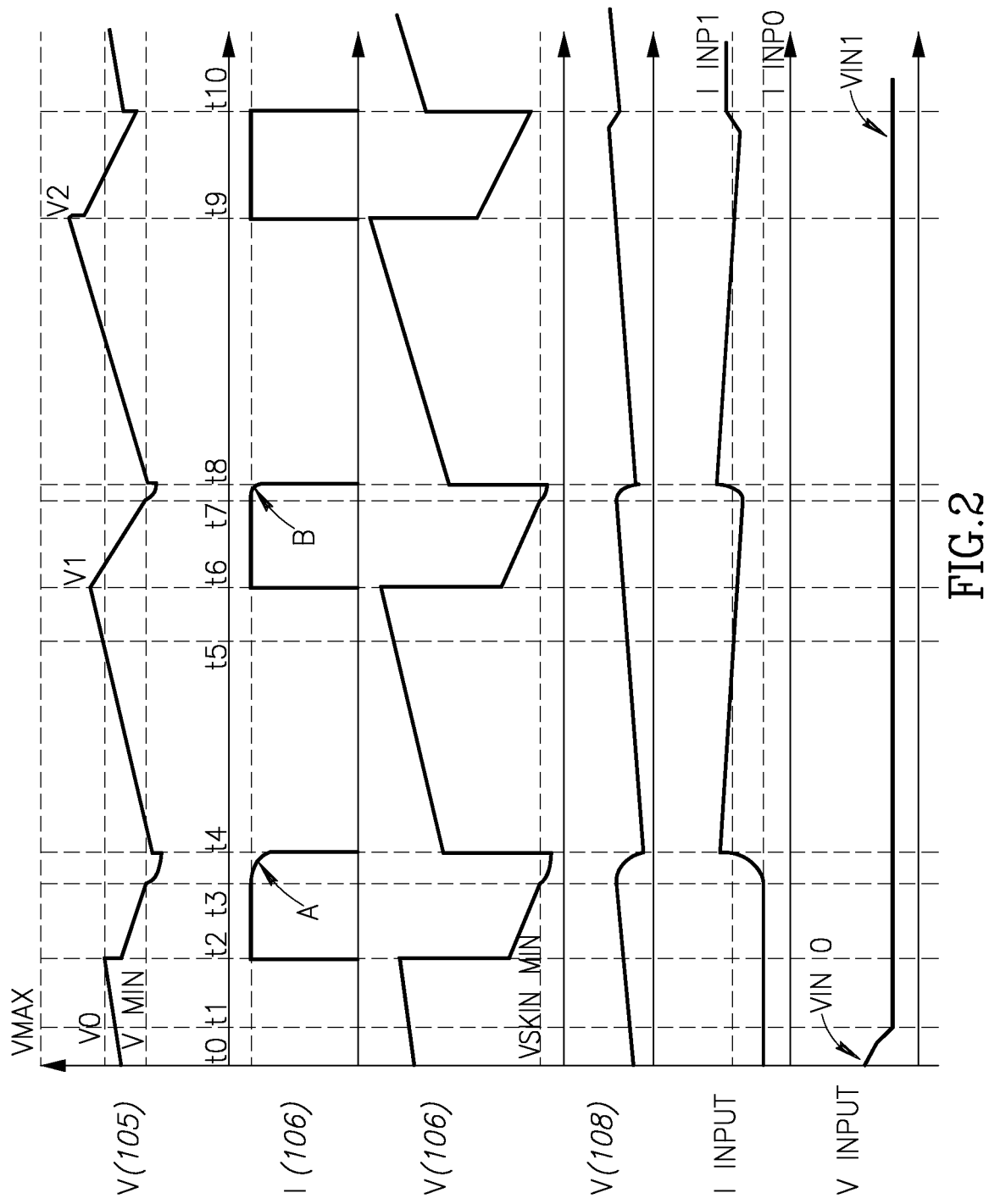
FIG. 2 is a timing diagram illustrating the operation of the current regulator in accordance with one embodiments of the present invention.

FIG. 2 is a timing diagram illustrating the operation of current regulator circuit 100 in accordance with the first embodiment of the present invention.

In operation of current regulator circuit 100, two different feed forward signals are used: the first one being the voltage level V(108) across voltage storage capacitor 108 and the second one being the input consumption current $I_{inp}$, measured flowing through resistor sense $R_{sens}$ 101.

The aforementioned two feed forward signals are mutually multiplied as explained below and supplied to PWM/PFM module 103 as a feedback signal $V_{fb}$.

FIG. 2 illustrates the various time intervals of the operation of circuit 100 divided in general into the following categories:

Over interval $t_0$-$t_1$, input voltage $V_{inp}$ or V(111) drops from $V_{in0}$ to $V_{in1}$ resulting in the charge of energy storage capacitor 105, to a positive level $V_0$ by time $t_2$.

Intervals $t_2$-$t_4$, $t_6$-$t_8$, and $t_9$-$t_{10}$ represent the "ON" time of circuit regulator 100 in which current sink driver 106 forms the pulses of constant current to feed diode array 112.

Intervals $t_0$-$t_2$, $t_4$-$t_6$, and $t_8$-$t_9$ are the time intervals in which energy storage capacitor 105 is being charged by current source 102.

Intervals $t_3$-$t_4$, $t_7$-$t_8$ are the time intervals representing the respective portions (A, B) of the current pulses generated by current sink driver 106 where the current undesirably varies while being pulled via diode array 112. This portion is reduced and eventually eliminated altogether is subsequent cycles of circuit 100 such as over interval $t_9$-$t_{10}$.

Referring now in further detail to the timing diagram of FIG. 2 and the circuit diagram in FIG. 1, the full operation of circuit 100 is being set forth below. At time $t_2$ current sink driver 106 is switched to an "ON" position and as a result, constant current I(106) starts to flow from capacitor 105 through diode array 112 (acting as the load). During the time interval that follows ($t_2$-$t_4$) a constant current I(106) flows from capacitor 105, thereby discharging it and so the voltage over capacitor 105 drops from $V_0$ to $V_{min}$.

Since the voltage over diode array 112 is constant, the voltage difference between capacitor 105 and diode array 112 drops over sink current regulator 106 which dissipates the aforementioned power drop.

At time $t_4$ when the voltage over current sink driver 106 reaches its lowest level, diode 107 connects voltage storage capacitor 108 which thereby samples the instantaneous voltage value over current sink driver 106.

In accordance with some embodiments of the present invention, two feed-forward signals of: 1) the voltage over storage capacitor 108 and 2) voltage drop on current sense resistor 101 are supplied to power monitor 109. Power monitor 109 then provides the feedback signal to either PWM or PFM module 103 which controls the current source 102 acting as a charger by supplying current to energy storage capacitor 105.

In accordance with some embodiments of the present invention, the PWM/PFM module 103 implements a control function given in formulas (1) and (2) below:

$$V_{fb} = V_{ref}(PWM/PFM) \tag{1}$$

$$V_{fb} = \{V(101) * V(108) * K\} \tag{2}$$

Where:
V(101)=voltage drop across input current sense resistor 101;
V(108)=instantaneous voltage on the storage capacitor 108; and
K=Voltage to current multiplication factor uA/V²

As discussed above, during interval $t_0$-$t_1$ the input voltage $V_{inp}$ of battery 111 drops from $Vin_0$ to $Vin_1$. Since the feedback control signal does not change $V_{fb}$ and input current $I_{inp}$ flowing through resistor 101 is still constant so that current source 102 input power consumption is decreased.

Over interval $t_0$-$t_2$, the voltage across energy storage capacitor 105 at time $t_2$ reaches $V_0$ level. At time $t_2$ the current sink driver 106 starts sinking constant current from energy storage capacitor 105 via diode array 112. At time $t_3$ voltage V(106) across current sink driver 106 becomes smaller than $V_{sink}$ min and as a result, current sink driver 106 loses the ability to stabilize the required current level flowing through diode array 112.

Over interval $t_3$-$t_4$ when V(106) become less than $V_{sink}$ min, current sink driver 106 becomes saturated and provides free discharge from energy storage capacitor 105 to diode array 112. The current I(106) become smaller and voltage V(108) on the voltage storage capacitor 108 follows (e.g. samples) the instantaneous voltage on current driver 106. Simultaneously, during $t_3$-$t_4$, feedback signal $V_{fb}$ arriving from power monitor 109 controls input current $I_{inp}$(101) so that input current $I_{inp}$(101) grows because the input power consumption V(108)*$I_{inp}$(101) must remain constant. The provided voltage V(108) deviation corresponds to the input current $I_{inp}$(101) variation from $I_{inp0}$ to $I_{inp1}$ so that the overall power consumption of circuit 100 remains constant.

The increase of the input current and as a result the output current of current source 102 leads to charging energy storage capacitor 105 to level $V_1$ which is higher than $V_0$ and therefore stores more energy which can now be supplied to diode array 112 over interval $t_6$-$t_8$ (another "ON" phase).

As can be seen by observing current O(106) of current sink driver 106, the undesirable drop (indicated by B) of current I(106) flowing through current sink driver 106 has improved over time interval $t_7$-$t_8$ compared with the undesirable current drop A over previous interval $t_3$-$t_4$. Consequently, this improved current drop is accompanied with a smaller voltage drop V(106) over current driver 106. The voltage V(108) over voltage storage capacitor 108 samples the instantaneous voltage on current regulator 106 and leads to an increase of the output current of the current source converter 102.

Over the next time period $t_8$-$t_9$, the energy storage capacitor 105 is charged to a voltage level V2 which can supply enough power to current driver 106 and forms the square wave of the current flowing through diode array 112 over the $t_9$-$t_{10}$ interval. From $t_{10}$ input current $I_{inp}$ flowing through $R_{sens}$ 101 is stabilized around level $I_{inp1}$ until any change or variation occurs to one or more parameters of the system such as: PWM/PFM voltage reference $V_{ref}$, voltage drop over diode array 112, temperature effect to electrical characteristic of energy storage capacitor 105, and voltage across power supply 111. Advantageously, current regulator circuit 100 offers low power dissipation over current sink driver 106 which provides high efficiency and even more importantly, an essential reduction of the capacitance (and hence the size) of energy storage capacitor 105. The reduction of size and weight is specifically beneficial for airborne payloads that require such a current regulator.

Further advantageously, current regulator circuit 100 offers continuous current consumption from a power source (e.g. battery) that is independent of any of the following: an input voltage level, diode array power consumption, environment temperature, and repetition rate and width of the current pulses via diode array 112.

Further advantageously, by using input current as feed forward signal V(108) and function $V_{fb}=\{V(101)*V(108)*K\}$ the feedback signal in current regulator circuit 100 guarantees: direct input current control and continuous current consumption from the power source (e.g. battery); and that control is never lost on voltage drop of the current sink driver 106.

Further advantageously, current regulator circuit 100 guarantees no dependence on the CPU for the control and for the continuous current consumption from the power source (e.g. battery).

Figure 3:
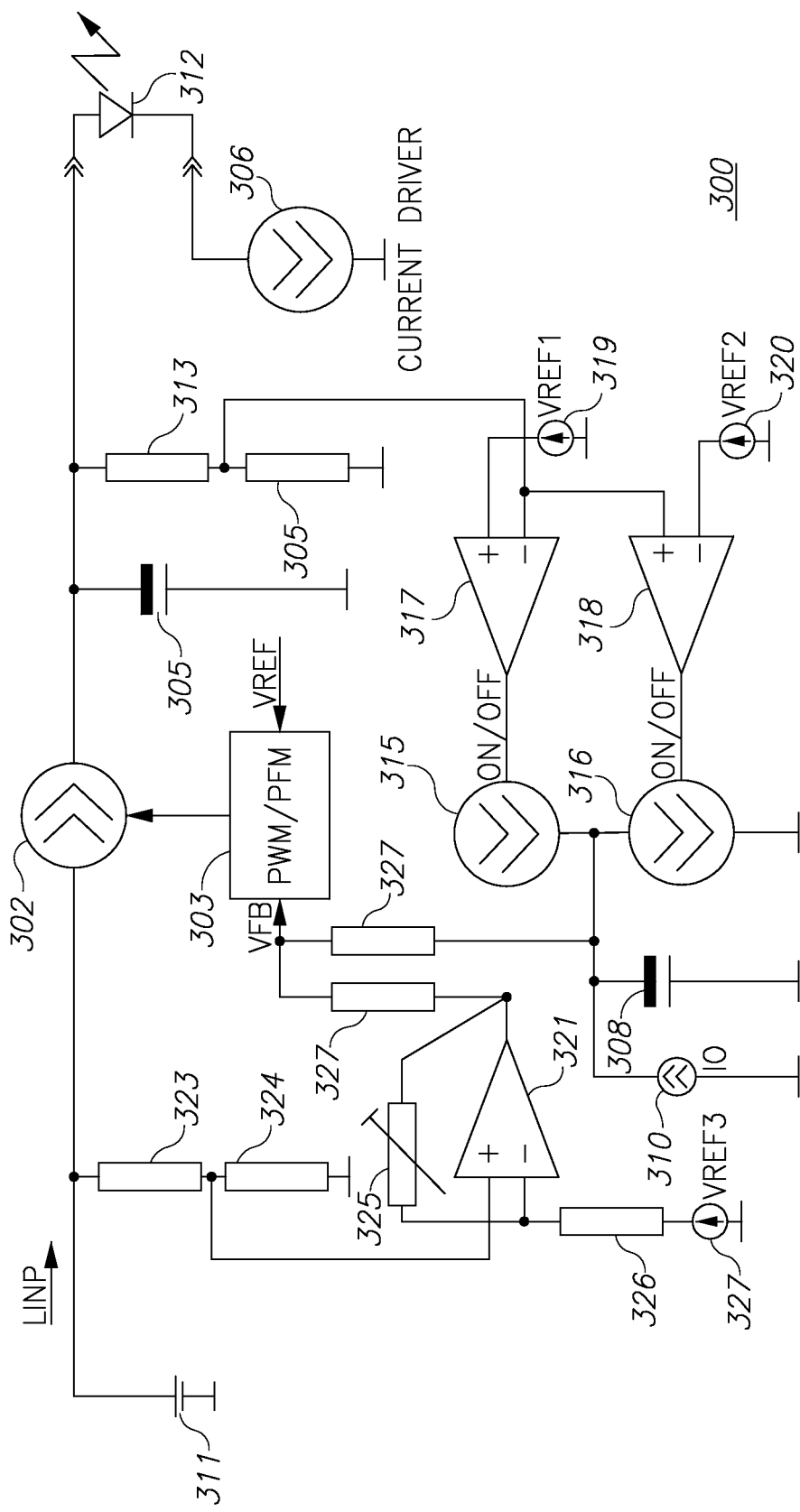
FIG. 3 shows a circuit diagram illustrating a current regulator in accordance with yet another embodiments of the present invention.

FIG. 3 shows a circuit diagram illustrating a current regulator 300 in accordance with another embodiment of the present invention. A laser diodes power supply circuit 300 may include the following components: an energy storage capacitor 305, current source 302 (charger), sink current regulator 306 (driver), PWM or PFM module 303, voltage comparators 317, 318, reference current source 315 and sink 316, input voltage monitor 321 with nonlinear gain controller 325, voltage references 319, 320, 327, voltage storage capacitor 308 and offset (io) current source 310.

During steady-state operation of current regulator circuit 300, sink current regulator 306 periodically supplies current pulses to the laser diode array 312. The voltage from the energy storage capacitor 305 via voltage divider (comprised of resistors 313 and 314) is supplied to the positive input of voltage comparator 318 and into the negative input of voltage comparator 317 and compared respectively to the reference voltages 319 (Vref1) and 320 (Vref2) by the comparators 317 and 318 respectively which provides control signals to the current sources 315 and 316 that in turn charge/discharge capacitor 308 accordingly.

Offset current source 310 provides very low continuous charge current to capacitor 308. Two voltage signals one from capacitor 308 and second one from the output of the amplifier 321 whose output nonlinearly depends of the input voltage level via resistors 327 and 328 supplied voltage feedback Vfb to PWM/PFM module 303 which controls the charge the charging operation of current source 302.

Figure 4:
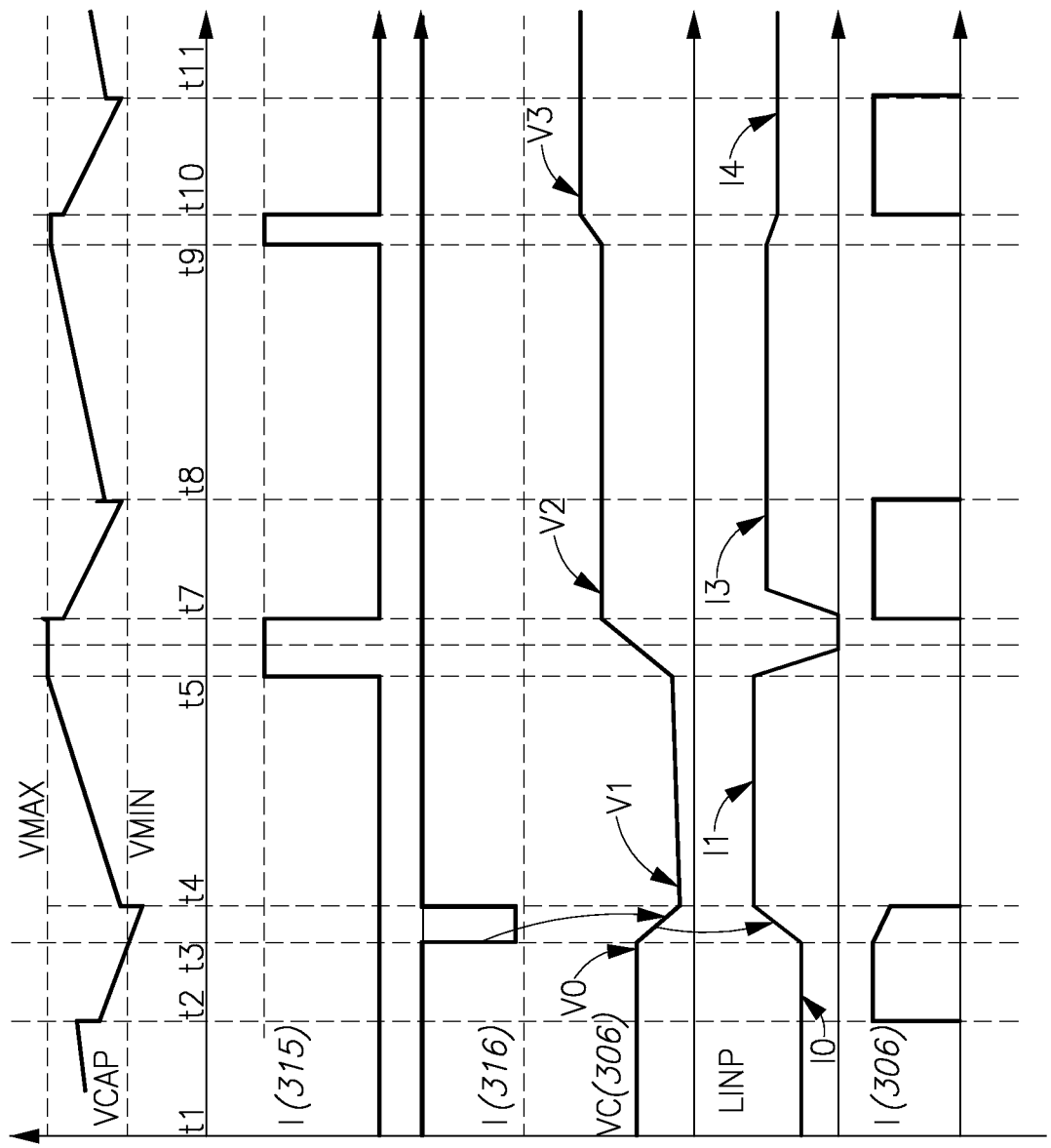
FIG. 4 is a timing diagram illustrating the operation of the current regulator in accordance with yet another embodiment of the present invention.

FIG. 4 is a timing diagram illustrating the operation of current regulator 300 in accordance some embodiments of the present invention.

The input current Iinp to the current source 302 (interval $t_1$-$t_3$) remains constant despite of switching on sink current regulator 306 at $t_2$ and the discharging of energy storage capacitor 305 by current I(306) flowing via sink current regulator 306 and via diode array 312. At time $t_3$ voltage Vcap across energy storage capacitor 305 becomes less than Vmin level and so voltage comparator 318 output signal activates current sink 316 and current I(316) starts discharging capacitor 308 whose voltage Vc(308) during time interval $t_3$-$t_4$ falls down from $V_0$ to $V_1$ level.

As a result, feedback signal Vfb to PWM/PFM module 303 changes and increases the input current consumption of the current source 302. At time $t_5$, voltage Vcap across energy storage capacitor 305 achieves its maximal Vmax level and voltage comparator 317 initiates current source 315 which at time interval $t_5$-$t_7$ charges capacitor 308 to voltage level V2 with current I(315). The voltage deviation across capacitor 308 at time $t_6$ stops the input current (Iinp) flow and further stops charging energy storage capacitor 305.

During the next time interval of $t_7$-$t_{10}$ the input current of current source 302 become I3 and the voltage Vcap across the capacitor 305 achieved the Vmax level. At time $t_9$, current source 315 is activated during interval $t_9$-$t_{10}$. Voltage across capacitor 308 is increased to a level that is above than the level of previous interval $t_2$-$t_7$. The input current Iinp however is almost uninterrupted at time $t_9$ and it is decreased to level 14 which still allows flow to one of the two comparators 317,318 activated by voltage level Vcap across energy storage capacitor 305.

The offset current 310 supplies the very small current through capacitor 308 and provide a positive voltage slope. Offset current 310 may provide the offset feedback which keeps the voltage across storage capacitor 305 at its minimum required level.

The same circuit behavior occurs, when the current through current sink regulator 306 is increased or when the discharge time is increased. As result of a higher load power, the input power consumption from power source 311 increases at $t_{10}$ and input current Iinp remains continuous without interruptions thereafter.

To summarize to operation of circuit 300, following are the various time intervals and their respective modes of operation:

Time interval t1-t2 is the time interval before activating current sink driver 306.

Time intervals $t_2$-$t_4$, $t_7$-$t_8$, and $t_{10}$-$t_{11}$ are the time intervals when energy storage capacitor 305 is being discharged by current sink driver 306 and when current pulse I(306) is formed via diode array 312.

Time intervals $t_3$ $t_4$, $t_5$-$t_7$, and $t_9$-$t_{10}$ are the time intervals where current source and sink supplies 315 and 316 are activated.

Advantageously, embodiments of circuit 300 may provide the following benefits:
  a) Low power dissipation on the current sink driver 306 which provides high efficiency and essential reduction the capacitance of the energy storage capacitor 305.
  b) Continuous current consumption from power source (e.g. battery) independent of the input voltage level, diode array power consumption, environment temperature, repetition rate and width of the current pulses via diode array 312.

c) Independence on the CPU for the control and for the continuous current consumption from the power source (e.g. battery).

d) Improved stability of the current source charger 302 in the wide input voltage 311 deviation as result of influence the nonlinearity gain of the operational amplifier 321. The gain value depends of the input voltage level.

e) Continuous current consumption control based on transformation by 317,318 voltage comparators the voltage feed forward signal from the energy storage capacitor 306 to the two different pulse width on/off control signals of the current source/sink 315,316. They forming the voltage on capacitor 308 and in superposition with operation amplifier 321 provided to the PWM/PFM feedback signal.

According to some embodiments of the present invention, constant current source 310 permanently charges the capacitor 308 and provides minimum power dissipation on the current sink driver 306.

The aforementioned two feed forward signals mutually summed up and supplied to PWM/PFM as the feedback signal ensure continuous current consumption from the power source (e.g. battery) without direct input and output current control.

Finally, constant current source 310 is permanently being charged the capacitor 308. In the above description, an embodiment is an example or implementation of the inventions.

The various appearances of "one embodiment," "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment. Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions. It will further be recognized that the aspects of the invention described hereinabove may be combined or otherwise coexist in embodiments of the invention.

It is to be understood that the phraseology and terminology employed herein is not to be construed as limiting and are for descriptive purpose only.

The principles and uses of the teachings of the present invention may be better understood with reference to the accompanying description, figures and examples.

It is to be understood that the details set forth herein do not construe a limitation to an application of the invention.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

The term "method" may refer to manners, means, techniques and procedures for accomplishing a given task including, but not limited to, those manners, means, techniques and procedures either known to, or readily developed from known manners, means, techniques and procedures by practitioners of the art to which the invention belongs. The descriptions, examples, methods and materials presented in the claims and the specification are not to be construed as limiting but rather as illustrative only.

Meanings of technical and scientific terms used herein are to be commonly understood as by one of ordinary skill in the art to which the invention belongs, unless otherwise defined.

The present invention may be implemented in the testing or practice with methods and materials equivalent or similar to those described herein.

While the invention has been described with respect to a limited number of embodiments, these should not be construed as limitations on the scope of the invention, but rather as exemplifications of some of the preferred embodiments. Other possible variations, modifications, and applications are also within the scope of the invention.

The invention claimed is:

1. A current regulator for a pulsed load, said current regulator comprising:
   an input power source;
   a current sense resistor;
   a capacitive energy storage device;
   an analog switch;
   a voltage storage capacitor;
   a current sink driver;
   a current source charger which receives input current from said input power source via said current sense resistor and provides a charge for said capacitive energy storage device coupled between said current source charger and said current sink driver which drives said pulsed load and discharges the voltage storage capacitor via the analog switch;
   a power monitor circuitry which generates a feedback signal, by mutually multiplying a voltage across said current sense resistor and a voltage across said voltage storage capacitor; and
   a pulse width modulation (PWM) or pulse frequency modulation (PFM) circuitry which controls said current source charger based on said feedback signal.

2. The current regulator according to claim 1, wherein said feedback signal is based on a voltage across said current sink driver and a voltage across said current sense resistor.

3. The current regulator according to claim 1, wherein said input power source comprises a battery.

4. The current regulator according to claim 1, wherein said pulsed load comprises laser diodes.

5. The current regulator according to claim 2, wherein said voltage storage capacitor is a capacitor connected via said analog switch in parallel to said current sink driver.

6. The current regulator according to claim 2, wherein the current regulator charger is regulated by using two feed forward signals, one from the input current sense and one from the voltage storage capacitor, wherein the two voltage signals are multiplied by the power monitor to yield said feedback signal.

7. The current regulator according to claim 2, wherein said voltage storage capacitor is charged by said current source charger that is connected in parallel and causes a feed forward signal to the power monitor circuitry to rise and minimize the power consumption of the current source charger by changing the feedback signal so that the current sink driver operates at optimum efficiency.

8. The current regulator according to claim 1, wherein said voltage storage capacitor is charged by said current source charger that is connected in parallel and causes a feed forward signal to the power monitor circuitry to rise and minimize the power consumption of the current source charger by changing the feedback signal so that the current sink driver operates at optimum efficiency.

9. A current regulator for a pulsed load, said current regulator comprising:

an input power source;
a capacitive energy storage device;
a voltage storage capacitor;
a current sink driver;
a current source charger which receives input current from said input power source via said current sense circuit and provides a charge for said capacitive energy storage device coupled between said current source charger and said current sink driver which drives said pulsed load;
a power monitor circuitry which generates a feedback signal, based on voltage across said capacitive energy storage; and
a pulse width modulation (PWM) or pulse frequency modulation (PFM) circuitry which controls said current source charger based on said feedback signal,
wherein said power monitor circuitry comprises a nonlinear amplifier connected to said input power source and two comparators having inputs connected to said capacity energy storage device and to respective reference voltage sources, and wherein outputs of the comparators supply control signals to said current source charger which provides charge/discharge of the voltage storage capacitor, and wherein the voltage across the voltage storage capacitor and the voltage from said nonlinear amplifier affect the feedback signal.

* * * * *